(12) United States Patent
Chang et al.

(10) Patent No.: US 7,667,302 B1
(45) Date of Patent: Feb. 23, 2010

(54) INTEGRATED CIRCUIT CHIP WITH SEAL RING STRUCTURE

(75) Inventors: Tien-Chang Chang, Hsinchu (TW); Shi-Bai Chen, Hsinchu County (TW); Tao Cheng, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/207,490

(22) Filed: Sep. 9, 2008

(51) Int. Cl.
*H01L 23/552* (2006.01)

(52) U.S. Cl. .................. 257/659; 257/508; 257/660; 257/662; 257/678; 257/688; 257/E21.574; 438/106; 438/118

(58) Field of Classification Search .................. 257/662
See application file for complete search history.

(56) References Cited

U.S. PATENT DOCUMENTS

| | | |
|---|---|---|
| 6,492,716 B1 | 12/2002 | Bothra et al. |
| 6,537,849 B1 | 3/2003 | Tsai |
| 6,943,063 B2 | 9/2005 | Tsai |
| 6,967,392 B2 | 11/2005 | Tsai |
| 7,265,438 B2 | 9/2007 | Tsai |
| 2006/0102980 A1* | 5/2006 | Nakashiba .................. 257/508 |
| 2006/0197214 A1 | 9/2006 | Chen |
| 2008/0061397 A1 | 3/2008 | Uchida |

* cited by examiner

*Primary Examiner*—N Drew Richards
*Assistant Examiner*—Kyoung Lee
(74) *Attorney, Agent, or Firm*—Winston Hsu

(57) ABSTRACT

An integrated circuit chip includes an analog and/or RF circuit block, a digital circuit, and a seal ring structure surrounding and protecting the analog and/or RF circuit block. The seal ring structure comprises a continuous outer seal ring, and a discontinuous inner seal ring divided into at least a first portion and a second portion. The second portion is situated in front of the analog and/or RF circuit block for shielding a noise from interfering the analog and/or RF circuit block.

14 Claims, 2 Drawing Sheets

US 7,667,302 B1

INTEGRATED CIRCUIT CHIP WITH SEAL RING STRUCTURE

BACKGROUND OF THE INVENTION

1. Field of the Invention

The present invention related to integrated circuits and, more particularly, to a seal ring structure of an integrated circuit chip having both a digital circuit and an analog and/or RF circuit on one chip.

2. Description of the Prior Art

Advances in fabrication technology have enabled entire functional blocks, which previously had been implemented as plural chips on a circuit board, to be integrated onto a single IC. One particularly significant development is mixed-signal circuits, which combine analog circuitry and digital logic circuitry onto a single IC.

However, a major technical hurdle to implementing mixed-signal circuits has been the coupling of noise between different portions of the IC, for example, from the digital to the analog portions of the IC.

Ordinarily, an integrated circuit chip includes a seal ring used to protect it from moisture degradation or ionic contamination. Typically, the seal ring is made of a stack of metal and contact/via layers and is manufactured step by step as sequential depositions of insulators and metals in conjunction together with the fabrication of the integrated circuit elements.

It has been found that the noise, such as those come from a digital power signal line such as $V_{DD}$ or signal pad of a digital circuit, propagates through the seal ring and adversely affects the performance of the sensitive analog and/or RF circuit.

SUMMARY OF THE INVENTION

It is one object of the present invention to provide an improved seal ring structure of an integrated circuit chip, which is capable of reducing a noise such as those coupling from a digital circuit.

To achieve the goals of the invention, an integrated circuit chip is provided, which includes an analog and/or RF circuit block and a seal ring structure surrounding the analog and/or RF circuit block. The seal ring structure comprises a continuous outer seal ring and a discontinuous inner seal ring divided into at least a first portion and a second portion. The second portion is situated in front of the analog and/or RF circuit block for shielding a noise from interfering the analog and/or RF circuit block.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to an integrated circuit chip with a seal ring structure. The seal ring structure includes an outer seal ring and an inner seal ring. The outer seal ring is a continuous ring, while the inner seal ring is divided into at least two separated portions including a conductive rampart that is situated in front of a sensitive analog and/or RF circuit block of the integrated circuit chip.

The conductive rampart of the inner seal ring shields the analog and/or RF circuit from noise, which may propagate through the outer seal ring, thereby reducing the noise-coupling effects. The continuous outer seal ring keeps the moisture and corrosive substances from entering the IC.

Figure 1:
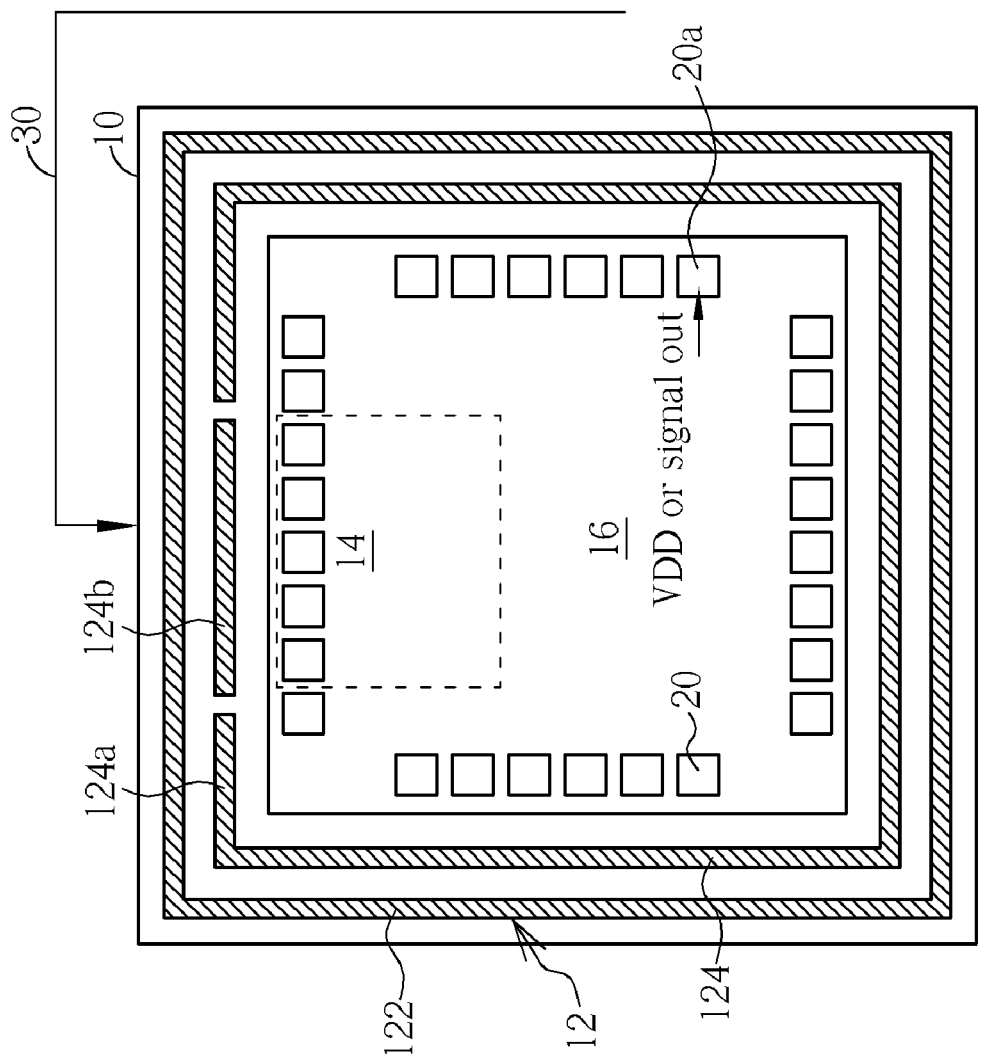
FIG. 1 is a schematic, planar view of an integrated circuit chip with a seal ring structure in accordance with one preferred embodiment of this invention.

Please refer to FIG. 1. FIG. 1 is a schematic, planar view of an integrated circuit chip 10 with a seal ring structure 12 in accordance with one preferred embodiment of this invention. As shown in FIG. 1, the integrated circuit chip 10 comprises at least one analog and/or RF circuit block 14, a digital circuit 16 and a seal ring structure 12 surrounding and protecting the analog and/or RF circuit block 14 and digital circuit 16.

The integrated circuit chip 10 may further comprise a plurality of input/output (I/O) pads 20. As previously described, noise may originate from a digital power $V_{DD}$ signal line or a signal out pad 20a of the digital circuit 16, for example, propagates through the seal ring and adversely affects the performance of the sensitive analog and/or RF circuit 14. A possible noise propagation path 30 is indicated in FIG. 1. The present invention aims to tackle this problem.

According to the present invention, the seal ring structure 12, which is disposed along the periphery of the chip, includes a continuous outer seal ring 122 and a discontinuous inner seal ring 124. The inner seal ring 124 is divided into two portions including a first portion 124a and a second portion 124b. Though the inner seal ring 124 is divided into two portions in this embodiment, it could be divided into more portions.

The first portion 124a and a second portion 124b may have substantially the same structure, which may be made of a stack of metal and contact/via layers and may be manufactured step by step as sequential depositions of insulators and metals in conjunction together with the fabrication of the integrated circuit elements.

The second portion 124b serves as an isolated conductive rampart that is situated in front of the analog and/or RF circuit block 14 for shielding the noise propagating through the continuous outer seal ring 122. Preferably, the length of the second portion 124b is equal to or greater than the length of the shielded analog and/or RF circuit block 14.

Figure 2:
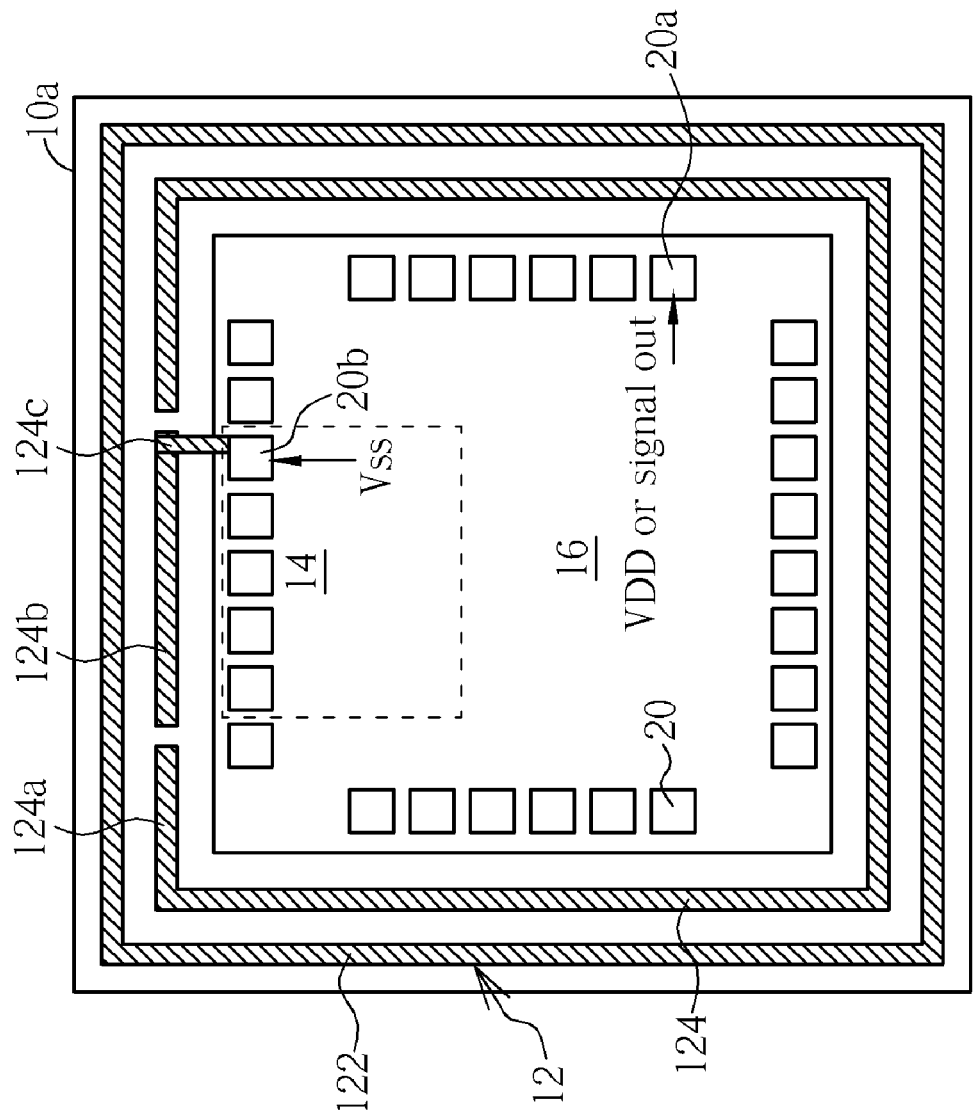
FIG. 2 is a schematic, planar view of an integrated circuit chip with a seal ring structure in accordance with another preferred embodiment of this invention.

FIG. 2 is a schematic, planar view of an integrated circuit chip 10a with a seal ring structure 12 in accordance with another preferred embodiment of this invention, wherein like numeral numbers designate like regions, layers or elements. As shown in FIG. 2, likewise, the integrated circuit chip 10a comprises at least one analog and/or RF circuit block 14, a digital circuit 16 and a seal ring structure 12 surrounding and protecting the analog and/or RF circuit block 14 and digital circuit 16.

The integrated circuit chip 10a may further comprises a plurality of input/output (I/O) pads 20. Noise, which may originate from a digital power $V_{DD}$ signal line or a signal out pad 20a of the digital circuit 16, propagates through the seal ring and adversely affects the performance of the sensitive analog and/or RF circuit block 14.

The seal ring structure 12 includes a continuous outer seal ring 122 and a discontinuous inner seal ring 124. The inner seal ring 124 is divided into two portions including a first portion 124a and a second portion 124b. Though the inner seal ring 124 is divided into two portions in this embodiment, it could be divided into more portions.

The first portion 124a and a second portion 124b may have substantially the same ring structure, which may be made of a stack of metal and contact/via layers and may be manufactured step by step as sequential depositions of insulators and metals in conjunction together with the fabrication of the integrated circuit elements.

The second portion 124b serves as an isolated conductive rampart for shielding the noise propagating through the continuous outer seal ring 122. Preferably, the length of the second portion 124b is equal to or greater than the length of the shielded analog and/or RF circuit block 14.

According to this invention, the second portion 124b may be coupled to an independent ground or an independent supply voltage. According to this invention, the second portion 124b may be coupled to the independent ground through an independent pad and an interconnection trace. The term "independent" used herein means that the ground, pad or supply voltage is not commonly used by the analog circuit, RF circuit or digital circuit.

The second portion 124b may be electrically coupled to an independent pad 20b through an interconnection trace 124c. The interconnection trace 124c may be comprised of a topmost metal layer of the integrated circuit chip 10a and an aluminum layer (not shown). By doing this, the second portion 124b could be coupled to an independent ground (not shown) or an independent supply voltage, such as $V_{SS}$, and the noise coupling can be significantly reduced.

Those skilled in the art will readily observe that numerous modifications and alterations of the device and method may be made while retaining the teachings of the invention.

What is claimed is:

1. An integrated circuit chip comprising:
    an analog and/or RF circuit block;
    a seal ring structure surrounding said analog and/or RF circuit block; said seal ring structure comprises:
    a continuous outer seal ring; and
    a discontinuous inner seal ring divided into at least a first portion and a second portion;
    wherein said second portion is situated in front of said analog and/or RF circuit block for shielding a noise from interfering said analog and/or RF circuit block.

2. The integrated circuit chip according to claim 1 wherein said noise is originated from a digital circuit in the integrated circuit chip.

3. The integrated circuit chip according to claim 1 wherein said second portion is coupled to an independent ground.

4. The integrated circuit chip according to claim 3 wherein said second portion is coupled to the independent ground through a pad and an interconnection trace.

5. The integrated circuit chip according to claim 4 wherein said interconnection trace is comprised of a topmost metal layer of said integrated circuit chip and an aluminum layer.

6. The integrated circuit chip according to claim 1 wherein said second portion is coupled to an independent supply voltage.

7. The integrated circuit chip according to claim 1 wherein a length of said second portion is equal to or greater than that of said analog and/or RF circuit block.

8. A seal ring structure of an integrated circuit chip, comprising:
    a continuous outer seal ring; and
    a discontinuous inner seal ring divided into at least a first portion and a second portion, wherein said second portion is situated in front of an analog and/or RF circuit block of said integrated circuit chip for shielding a noise from interfering said analog and/or RF circuit block.

9. The seal ring structure according to claim 8 wherein said noise is originated from a digital circuit in said integrated circuit chip.

10. The seal ring structure according to claim 8 wherein said second portion is coupled to an independent ground.

11. The seal ring structure according to claim 10 wherein said second portion is coupled to said independent ground through a pad and an interconnection trace.

12. The seal ring structure according to claim 11 wherein said interconnection trace is comprised of a topmost metal layer of said integrated circuit chip and an aluminum layer.

13. The seal ring structure according to claim 8 wherein said second portion is coupled to an independent supply voltage.

14. The seal ring structure according to claim 8 wherein a length of said second portion is equal to or greater than that of said analog and/or RF circuit block.

* * * * *